United States Patent

Nam

[11] Patent Number: 5,594,380
[45] Date of Patent: Jan. 14, 1997

[54] BOOTSTRAP CIRCUIT AND DATA OUTPUT BUFFER HAVING THE BOOTSTRAP CIRCUIT

[75] Inventor: Jong G. Nam, Kyoungki-do, Rep. of Korea

[73] Assignee: Hyubdai Electronics Industries Co., Ltd., Kyoungki-do, Rep. of Korea

[21] Appl. No.: 430,873

[22] Filed: Apr. 28, 1995

[30] Foreign Application Priority Data

Apr. 29, 1994 [KR] Rep. of Korea .................. 94-9309

[51] Int. Cl.$^6$ ............................................ H03K 17/16
[52] U.S. Cl. .................. 327/390; 327/389; 327/427; 327/589; 326/88
[58] Field of Search ................................ 327/185, 389, 327/390, 427, 589; 326/56, 57, 58, 82, 83, 88

[56] References Cited

U.S. PATENT DOCUMENTS

| | | | |
|---|---|---|---|
| 4,071,783 | 1/1978 | Knepper | 326/87 |
| 4,382,194 | 5/1983 | Nakano et al. | 327/589 |
| 4,574,203 | 3/1986 | Baba | 327/390 |
| 4,772,812 | 9/1988 | Desmarais | 326/57 |
| 4,806,798 | 2/1989 | Kanauchi | 326/57 |
| 5,241,502 | 8/1993 | Lee et al. | 365/203 |
| 5,467,054 | 11/1995 | Ikeda | 327/589 |

FOREIGN PATENT DOCUMENTS

| | | | |
|---|---|---|---|
| 0046216 | 2/1982 | European Pat. Off. | 326/88 |
| 2752473A1 | 6/1978 | Germany . | |

OTHER PUBLICATIONS

Chu et al., IBM Technical Disclosure Bulletin—"Bootstrap Push-Pull Driver", Aug. 1975, pp. 710–712.

*Primary Examiner*—Terry Cunningham
*Attorney, Agent, or Firm*—Morgan & Finnegan, L.L.P.

[57] ABSTRACT

A bootstrap circuit comprising a capacitive device connected between an input line and an output line to boost a signal from the input line, a first voltage supply path being selectively driven in response to a voltage on the output line to transfer or block a supply voltage from a supply voltage source to the output line, a second voltage supply path connected in parallel to the first voltage supply path to transfer or block the supply voltage from the supply voltage source to the output line, and a controller for controlling the second voltage supply path in response to the signal from the input line. According to the present invention, the bootstrap circuit enhances a response speed of an output signal with respect to an input signal. Therefore, the bootstrap circuit can boost the input signal stably and accurately regardless of an impulse noise component.

4 Claims, 2 Drawing Sheets

BOOTSTRAP CIRCUIT AND DATA OUTPUT BUFFER HAVING THE BOOTSTRAP CIRCUIT

BACKGROUND OF TEE INVENTION

1. Field of the Invention

The present invention relates in general to a bootstrap circuit for boosting a voltage of an input signal, and more particularly to a bootstrap circuit for enhancing a response speed with respect to the input signal to minimize a noise effect,

2. Description of the Prior Art

Generally, a bootstrap circuit is adapted to boost a voltage of an input signal above a supply voltage to allow a circuit at a subsequent stage to generate an output signal of a sufficiently high voltage. The bootstrap circuit is provided at the front stage of a wordline driver or a data output buffer for a semiconductor integrated circuit device including an NMOS transistor, to boost the voltage of a signal being supplied to the wordline-driver or the data output buffer.

However, such a conventional bootstrap circuit has a disadvantage in that it cannot supply a sufficiently boosted voltage to the wordline driver or the data output buffer because it has a low response speed with respect to the input signal. This problem becomes more serious when an impulse noise component is contained in the input signal. For this season, the wordline driver or the data output buffer is unable to generate a normal output signal and, furthermore, the semiconductor integrated circuit device is degraded in reliability. The above-mentioned problem with the conventional bootstrap circuit will hereinafter be described in detail with reference to FIG. 1.

Referring to FIG. 1, there is shown a circuit diagram of a data output buffer fox a semiconductor integrated circuit device in which a conventional bootstrap circuit 10 is included. As shown in this drawing, the bootstrap circuit 10 is connected between a first node N1 and a second node N2. The data output buffer comprises a first NAND gate GN1 fox inputting a data signal KD from an input line 11 and an output enable signal OE from a control line When the output enable signal OE from the control line 13 is high in logic high, the first NAND gate GN1 inverts the data signal RD from the input line 11 and supplies the inverted data signal to the first node N1.

The data output buffer further comprises a first NMOS transistor MN1 having a gate for inputting a signal from the second node N2. When the signal from the second node N2 is high in level, the first NMOS transistor MN1 is turned on to generate high level data Dout on an output line 15. The high level data Dout on the output line 15 has a voltage lower than that at the second node N2 by the threshold voltage of the first NMOS transistor MN1.

The data output buffer further comprises a second NAND gate GN2, a second NMOS transistor MN2 and first and second inverters GI1 and GI2. When the output enable signal OE from the control line 13 is a logic high, the second NAND gate GN2 and the first and second inverters GI1 and GI2 invert the data signal RD from the input line 11 and supply the inverted data signal to a gate of the second NMOS transistor MN2. When the inverted data signal from the second inverter GI2 is a logic high, the second NMOS transistor MN2 is turned on, thereby causing low level (i.e., ground voltage Vss) data Dout to be generated on the output line 15.

On the other hand, the bootstrap circuit 10 includes a third inverter GI3 and a capacitor C1 connected in series between the first node N1 and a third node N3, and a third NMOS transistor MN3 connected between a supply voltage source and the third node N3 The third NMOS transistor MN3 includes a gate and a drain connected in common to the supply voltage source. When a voltage at the third node N3 is lower than a level of (supply voltage Vcc—threshold voltage of third NMOS transistor MN3), the third NMOS transistor MN3 is turned on to transfer the Supply voltage Vcc from the supply voltage source to the third node N3. The third inverter GI3 is adapted to re-invert the inverted data signal at the first node N1 and supply the re-inverted data signal to the capacitor C1. When an output signal from the third inverter GI3 is a logic low, the capacitor C1 stores the supply voltage Vcc from the supply voltage source which is transferred thereto through the third NMOS transistor MN3 and the third node N3. At this time, the voltage at the third node N3 is boosted to the level of (supply voltage Vcc—threshold voltage of third NMOS transistor MN3) according to a charge amount stored in the capacitor C1. On the contrary, when the output signal from the third inverter GI3 is a logic high, namely, it has the supply voltage Vcc, the voltage at the third node N3 is boosted to a level of (double supply voltage Vcc—threshold voltage of third NMOS transistor MN3). This results from a voltage on the capacitor C1 being added to an output voltage of the third inverter GI3.

The bootstrap circuit 10 further includes a PMOS transistor MP1 connected between the third and second nodes N3 and N2, and a fourth NMOS transistor MN4 connected between the second node N2 and a ground voltage source. The PMOS transistor MP1 and the fourth NMOS transistor MN4 have gates for inputting the data signal from the first node N1, respectively. When the data signal from the first node N1 is a logic low, the PMOS transistor MP1 is turned on to transfer the boosted voltage from the third node N3 to the Ware of the first NMOS transistor MN1 connected to the second node N2. As the PMOS transistor MP1 is turned on, the voltage charged on the capacitor C1 is discharged to the gate of the first NMOS transistor MN1 through the third node N3, the PMOS transistor MP1 and the second node N2. On the contrary, when the data signal from the first node N1 is a logic high, the fourth NMOS transistor MN4 is turned on to transfer the ground voltage Vss from the ground voltage source to the gate of the first NMOS transistor MN1 connected to the second node N2.

As mentioned above, the conventional bootstrap circuit 10 is adapted to boost the voltage of the input signal using the capacitor C1. A level of the boosted voltage is determined according to a capacitance of the capacitor C1. For this reason, the capacitor C1 must have a large capacitance to boost the voltage of the input signal to a sufficiently high level.

However, in the case where the capacitor C1 has the large capacitance, a charging time thereof becomes long, thereby causing the conventional bootstrap circuit 10 to have a low response speed with respect to the input signal. For this reason, when an impulse noise component is contained in the input signal, the conventional bootstrap circuit 10 cannot boost the voltage of the input signal to a sufficiently high level. Because of such a boosted voltage signal from the conventional bootstrap circuit 10, the pull-up NMOS transistor MN1 is unable to output the data normally and the semiconductor integrated circuit device is degraded in reliability.

SUMMARY OF THE INVENTION

Therefore, the present invention has been made in view of the above problem, and it is an object of the present invention to provide a bootstrap circuit for enhancing the response speed of an output signal with respect to an input signal to minimize the effect of an impulse noise component.

It is another object of the present invention to provide a data output buffer for amplifying an input data signal accurately although an impulse noise component is contained in the input data signal.

In accordance with one aspect of the present invention, there is provided a bootstrap circuit comprising a capacitive device connected between an input line and an output line to boost a signal from the input line; a first voltage supply path being selectively driven in response to a voltage on the output line to transfer or block a supply voltage from a supply voltage source to the output line; a second voltage supply path connected in parallel to the first voltage supply path to transfer or block the supply voltage from the supply voltage source to the output line; and control means for controlling the second voltage supply path in response to the signal from the input line.

In accordance with another aspect of the present invention, there is provided a data output buffer comprising an input line for inputting a binary signal having a binary logic state; an NMOS transistor having a gate connected to the input line, the NMOS transistor amplifying a first logic voltage of the binary signal from the input line; a capacitive device connected between a boosting node and the input line to boost the binary signal from the input line; a first voltage supply path being selectively driven in response to a voltage at the boosting node to transfer block a supply voltage from a supply voltage source to the boosting node; a second voltage supply path connected in parallel to the first voltage supply path to transfer or block the supply voltage from the supply voltage source to the boosting node; control means for controlling the second voltage supply path in response to the binary signal from the input line; switching means connected among the input line, the boosting node and the rate of the NMOS transistor to transfer the voltage at the boosting node to the gate of the NMOS transistor in response to the first logic voltage of the binary signal from the input line; and a MOS transistor amplifying a second logic voltage of the binary signal from the input line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
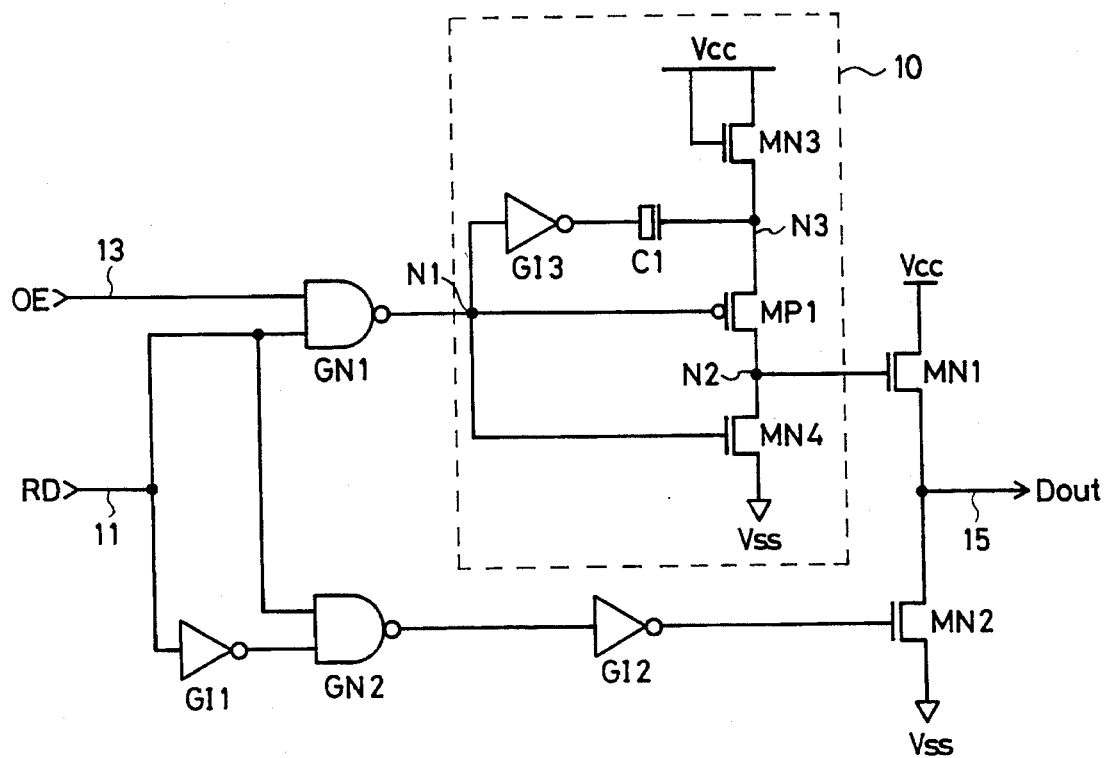
FIG. 1 is a circuit diagram of a data output buffer for a semiconductor integrated circuit device to which a conventional bootstrap circuit is applied.
Figure 2:
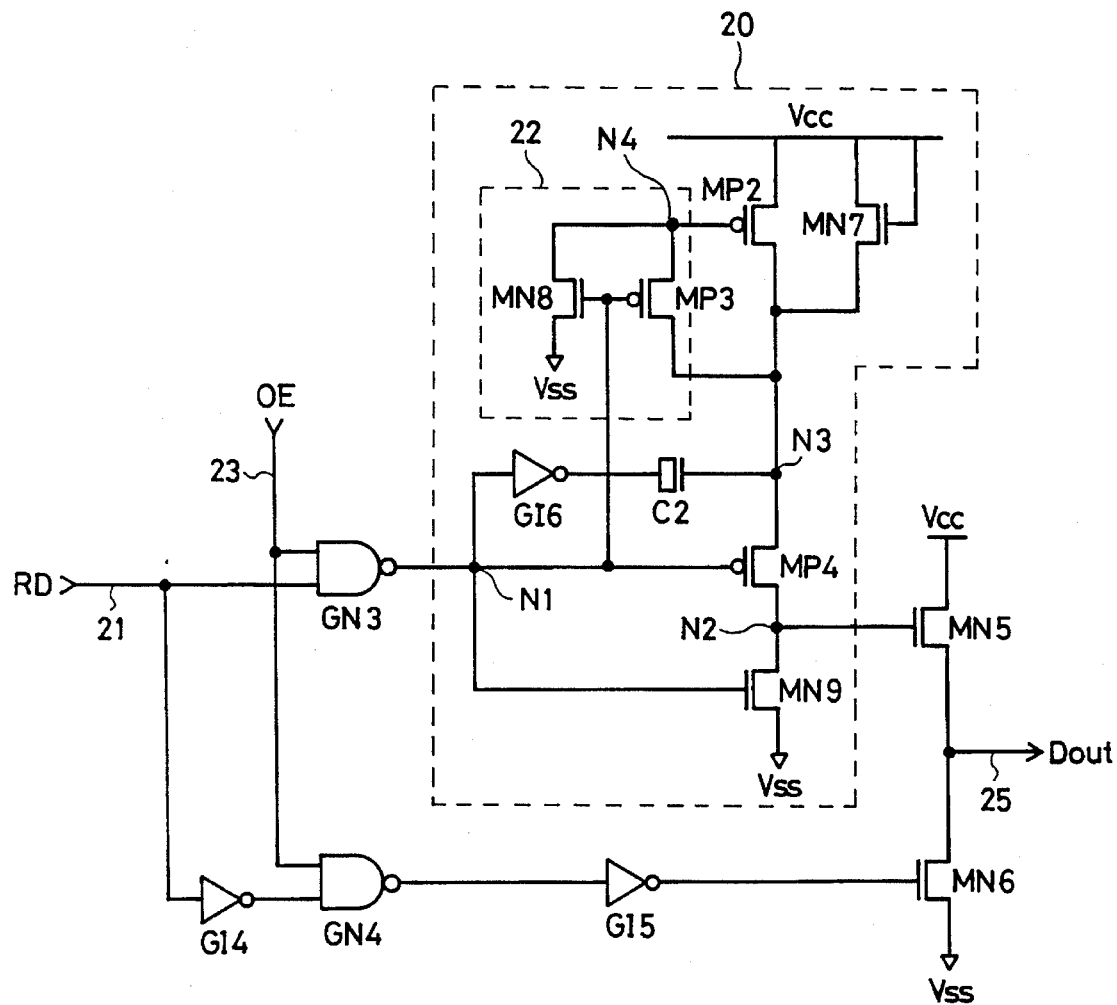
FIG. 2 is a circuit diagram of a data output buffer for a semiconductor integrated circuit device to which a bootstrap circuit of the present invention is applied.

Referring to FIG. 2, there is shown a circuit diagram of a data output buffer for a semiconductor integrated circuit device in which a bootstrap circuit 20 of the present invention is included. As shown in this drawing, the data output buffer comprises a first NAND gate GN3 fox inputting a data signal RD from an input line 2 and an output enable signal OE from a control line 23, and a first NMOS transistor MN5 connected between a supply voltage source and an output line 25. When the output enable signal OE from the control line 23 is a logic high, the first NAND gate GN3 inverts the data signal KD from the input line 21 and supplies the inverted data signal to a first node N1. The first NMOS transistor MN5 has a gate for inputting a signal from a second node N2. When the signal from the second node N2 is high in level, the first NMOS transistor MN5 is turned on to generate high level data Dout on output line 25.

The data output buffer further comprises a first inverter GI4 for inverting the data signal RD from the input line 21, a second NAND gate GN4 for inputting an output signal from the first inverter GI4 and the output enable signal OE from the control line 23, a second inverter GI5 for inverting an output signal from the second NAND gate GN4, and a second NMOS transistor MN6 connected between the output line 25 and a ground voltage source. When the output enable signal OE from the control line 23 is a logic high, the second NAND gate GN4 re-inverts the inverted data signal from the first inverter GI4 and supplies the re-inverted data signal to gate of the second NMOS transistor MN6 through the second inverter GI5. When an output signal from the second inverter GI5 is high in logic, the second NMOS transistor MN6 is turned on to connect the output line 25 to the ground voltage source. As a result, low level (i.e., ground voltage Vss) data Dout is generated on the output line 25.

On the other hand, the bootstrap circuit 20 is connected between the first and second nodes N1 and N2 to boost the data voltage at the first node N1. To this end, the bootstrap circuit 20 includes a third inverter GI6 and a capacitor C2 connected in series between the first node N1 and a third node N3, and a first PMOS transistor MP2 and a third NMOS transistor MN7 connected in parallel between the supply voltage source and the third node N3.

The third NMOS transistor MN7 includes a gate and a drain connected in common to the supply voltage source. As a result, the third NMOS transistor MN7 performs a unidirectional voltage transfer function. When a voltage at the third node N3 is lower than a level of(supply voltage Vcc—threshold voltage of third NMOS transistor MN7), the third NMOS transistor MN7 is turned on to transfer the supply voltage Vcc from the supply voltage source to the third node N3. On the contrary, when the voltage at the third node N3 is higher than the level of (supply voltage Vcc—threshold voltage of third NMOS transistor MN7), the third NMOS transistor MN7 is turned off. As the third NMOS transistor MN7 is turned off, the voltage at the third node N3 is not discharged to the supply voltage source.

The first PMOS transistor MP2 forms a unidirectional current path. To this end, the first PMOS transistor MP2 has a gate connected to a fourth node N4. When a voltage at the third node N4 is lower than a level of (supply voltage Vcc—threshold voltage of first PMOS transistor MP2), the first PMOS transistor MP2 is turned on to transfer the supply voltage Vcc from the supply voltage source to the third node N3. On the contrary, when the voltage at the fourth node N4 is higher than the level of (supply voltage Vcc—threshold voltage of first PMOS transistor MP2), the first PMOS transistor MP2 is turned off. As the first PMOS transistor MP2 is turned off, the voltage at the third node N3 is not discharged to the supply voltage source.

The third inverter GI6 is adapted to re-invert the inverted data signal at the first node N1 and supply the re-inverted data signal to the capacitor C2. The capacitor C2 is charged with the supply voltage Vet from the supply voltage source which is transferred thereto through the first PMOS transistor MP2, the third NMOS transistor MN7 and the third node N3. When an output signal from the third inverter GI6 is a logic low, the capacitor C2 maintains the voltage at the third node N3 at the same level as that of its charged voltage. On the contrary, when the output signal from the third inverter GI6 is a logic high, namely, it is the level of the supply voltage Vcc, the capacitor C2 allows the third node N3 to maintain a voltage 2 Vcc which is obtained by adding the voltage i.e., supply voltage Vcc) charged on the capacitor C2 to an output voltage (i.e., supply voltage Vcc) from the third inverter GI6. As a result, when the output signal from the third inverter GI6 is a logic low, the voltage at the third node N3 is gradually increased from "0 V" to the supply voltage Vcc according to the voltage being charged on the capacitor C2. In the case where the output signal from the third inverter GI6 is a logic high, the third node N3 maintains the boosted voltage 2 Vcc which is obtained by adding the charged voltage Vcc on the capacitor C2 to the output voltage Vcc from the third inverter GI6.

The bootstrap circuit 20 further includes a current path controller 22 connected between the first and fourth nodes N1 and N4. The current path controller 22 is adapted to turn on/off the first PMOS transistor MP2 according to a logic state of the data signal at the first node N1. To this end, the current path controller 22 includes a fourth NMOS transistor MN8 connected between the fourth node N4 and the ground voltage source, and a second PMOS transistor MP3 connected between the fourth and third nodes N4 and N3. The fourth NMOS transistor MN8 and the second PMOS transistor MP3 have gates for inputting the data signal from the first node N1, respectively.

When the data signal from the first node N1 is a logic high, the fourth NMOS transistor MN8 is turned on to change the voltage at the fourth node N4 to the ground voltage Vss. The ground voltage Vss at the fourth node N4 ruins on the first PMOS transistor MP2, thereby causing the supply voltage Vcc from the supply voltage source to be transferred to the third node N3.

On the contrary, when the data signal from the first node N1 is a logic high, the second PMOS transistor MP3 is turned on to transfer the boosted voltage 2 Vcc from the third node N3 to the fourth node N4. The boosted voltage 2 Vcc at the fourth node N4 turns off the first PMOS transistor MP2, thereby causing the boosted voltage 2 Vcc at the third node N3 not to be discharged to the supply voltage source.

As a result, in the case where the voltage at the third node N3 is lower than the supply voltage Vcc from the supply voltage source, the first PMOS transistor MP2 is turned on together with the third NMOS transistor MN7. For this reason, a resistance between the supply voltage source and the third node N3 becomes very small, resulting in a great increase in an amount of current being supplied to the third node N3. As a result, the voltage at the third node N3 is, boosted at a very high speed. Also, the first PMOS transistor MP2 acts to boost the voltage at the third node N3 to the higher level by transferring the supply voltage Vcc from the supply voltage source with no attenuation regardless of the threshold voltage of the third NMOS transistor MN7.

The bootstrap circuit 20 further includes a third PMOS transistor MP4 connected between the third and second nodes N3 and N2, and a fifth NMOS transistor MN9 connected between the second node N2 and the ground voltage source. The third PMOS transistor MP4 and the fifth NMOS transistor MN9 have gates for inputting the data signal from the first node N1, respectively. When the data signal from the first node N1 is a logic low, the third PMOS transistor MP4 is turned on to transfer the boosted voltage 2 Vcc from the third node N3 to the gate of the first NMOS transistor MN5 connected to the second node N2. As a result, the first NMOS transistor MN5 is turned on to generate the high level data Dout on the output line 25. At this time, the high level data Dout on the output line 25 has a voltage lower than the boosted voltage 2 Vcc by the threshold voltage of the first NMOS transistor MN5.

On the contrary, in the case where the data signal from the first node N1 is a logic high, the fifth NMOS transistor MN9 is turned on to transfer the ground voltage Vss from the ground voltage source to the gate of the first NMOS transistor MN5 connected to the second node N2. AS a result, the first NMOS transistor MN5 is turned off.

As apparent from the above description, according to the present invention, the bootstrap circuit minimizes the resistance of the charging path to increase greatly the amount of current being supplied to the capacitor. Therefore, the bootstrap circuit of the present invention has the effect of enhancing the response speed of the output signal with respect to the input signal and generating the stably boosted voltage even though an impulse noise component is contained in the input signal.

Also, according to the present invention, the data output buffer can stably amplify the input data signal according to the stably boosted voltage from the bootstrap circuit. Therefore, the data output buffer of the present invention has the effect of enhancing the reliability of the semiconductor integrated circuit device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bootstrap circuit comprising:

an inverter means inverting a signal from an input line;

a capacitive device connected between said inverter means and a boost node to boost said inverted signal from said inverter means;

a first voltage supply path being selectively driven in response to a voltage on said boost node to transfer or block a supply voltage from a supply voltage source to said boost node;

a second voltage supply path connected in parallel to said first voltage supply path to transfer or block the supply voltage from said supply voltage source to said boost node;

a first switching means for transferring a ground voltage from a ground voltage source to a control input of said second voltage supply path when the signal from said input line is high in logic;

a second switching means for transferring the voltage on said boost node to said control input of said second voltage supply path when the signal from said input line is low in logic;

a PMOS transistor connected between said boost node and an output line for transferring a boosted voltage on said boost node to said output line in response to the signal from said input line; and an NMOS transistor connected between said output line and said ground voltage-source for transferring the ground voltage from said ground voltage source to said output line in response to the signal from said input line.

2. A bootstrap circuit as set forth in claim 1, wherein said second voltage supply path includes a PMOS transistor for transferring the supply voltage from said supply voltage source to said boost node with substantially no attenuation.

3. A bootstrap circuit as set forth in claim 1, wherein said first supply voltage path includes an NMOS transistor having a gate and a drain connected in common to said supply voltage source and a source connected to said boost node.

4. In a data output buffer having an input line for inputting a binary signal having a binary logic state, a pull-up transistor connected between a supply voltage source and an output line for amplifying a first logic voltage of the binary signal, a pull-down transistor connected between said output line and a ground voltage source for amplifying a second logic voltage of the binary signal, and a bootstrap circuit for boosting a voltage of the binary signal from said input line and supplying the boosted voltage to a gate of said pull-up transistor, said bootstrap circuit comprising:

an inverter means inverting the binary signal from said input line;

a capacitive device connected between a boosting node and said inverter means to boost the inverted binary signal from said inverter means;

a first voltage supply path being selectively driven in response to a voltage on said boosting node to transfer or block a supply voltage from said supply voltage source to said boosting node;

a second voltage supply path connected in parallel to said first voltage supply path to transfer or block the supply voltage from said supply voltage source to said boosting node;

a first switching means for transferring a ground voltage from said ground voltage source to a control input of said second voltage supply path when the signal from said input line is high in logic;

a second switching means for transferring the voltage on said boosting node to said control input of said second voltage supply path when the signal from said input line is low in logic;

a PMOS transistor connected between said boosting node and the gate of said pull-up transistor for transferring a boosted voltage on said boost node to the gate of said pull-up transistor in response to the signal from said input line; and an NMOS transistor connected between the gate of said pull-up transistor and said ground voltage source for transferring the ground voltage from said ground source to the gate of said pull-up transistor in response to the signal from said input line.

\* \* \* \* \*